US007090047B1

(12) United States Patent
Lee et al.

(10) Patent No.: US 7,090,047 B1
(45) Date of Patent: Aug. 15, 2006

(54) SURROUND SOUND POSITIONING TOWER SYSTEM AND METHOD

(75) Inventors: Noel Lee, Las Vegas, NV (US); Demian Martin, San Leandro, CA (US)

(73) Assignee: Monster Cable Products, Inc., Brisbane, CA (US)

( * ) Notice: Subject to any disclaimer, the term of this patent is extended or adjusted under 35 U.S.C. 154(b) by 0 days.

(21) Appl. No.: 10/655,095

(22) Filed: Sep. 3, 2003

(51) Int. Cl.
*A47B 81/06* (2006.01)
*H05K 5/02* (2006.01)
*H04R 5/02* (2006.01)
*H04R 1/02* (2006.01)

(52) U.S. Cl. ...................... 181/199; 181/148; 381/300; 381/387

(58) Field of Classification Search ................ 181/199, 181/148, 144, 145, 197, 198; 381/332, 333, 381/387, 388, 395, 301, 345, 300, 303, 304, 381/305
See application file for complete search history.

(56) References Cited

U.S. PATENT DOCUMENTS

| | | | | | |
|---|---|---|---|---|---|
| 3,754,618 | A | * | 8/1973 | Sasaki | 181/145 |
| 4,054,750 | A | * | 10/1977 | Montgomery et al. | 381/335 |
| 4,139,734 | A | * | 2/1979 | Fincham | 181/145 |
| 4,267,405 | A | * | 5/1981 | Russell | 381/335 |
| 4,292,679 | A | * | 9/1981 | Kondo et al. | 181/171 |
| 4,365,114 | A | * | 12/1982 | Soma | 181/144 |
| 4,441,577 | A | * | 4/1984 | Kurihara | 181/147 |
| 4,450,322 | A | * | 5/1984 | Wilson | 181/147 |
| 4,553,630 | A | * | 11/1985 | Ando | 181/144 |
| 4,696,037 | A | * | 9/1987 | Fierens | 181/145 |
| 4,757,544 | A | * | 7/1988 | Guy | 381/387 |
| 4,811,406 | A | * | 3/1989 | Kawachi | 381/387 |
| 4,884,655 | A | * | 12/1989 | Freadman et al. | 181/145 |
| 4,953,223 | A | * | 8/1990 | Householder | 381/387 |
| 5,802,190 | A | * | 9/1998 | Ferren | 181/144 |
| 6,603,859 | B1 | * | 8/2003 | Asano | 381/59 |
| 6,628,793 | B1 | * | 9/2003 | Porzilli et al. | 181/144 |
| 6,643,379 | B1 | * | 11/2003 | Onglao | 181/199 |

FOREIGN PATENT DOCUMENTS

| | | | | |
|---|---|---|---|---|
| DE | 3916496 | A1 | * | 11/1990 |
| DE | 4219689 | A1 | * | 12/1993 |
| JP | 60186192 | A | * | 9/1985 |
| JP | 61020489 | A | * | 1/1986 |
| JP | 62018898 | A | * | 1/1987 |

(Continued)

OTHER PUBLICATIONS

Sound Alignment-System, Product Review-Checkpoint Tools, May 2002.

(Continued)

*Primary Examiner*—Edgardo San Martin
(74) *Attorney, Agent, or Firm*—LaRiviere, Grubman & Payne, LLP

(57) ABSTRACT

A surround sound system and method involving a surround sound tower; a base plate; and a structure for positioning the surround sound tower on the base plate, the surround sound tower being mounted on, and normal to, the positioning structure for customizing sound direction and constructive interference patterns by interactively positioning the sound tower and/or at least one sound tower and by modular usage of tweeters, economizing floor space, especially in a home theater environment. The positioning structure may have a structure for indicating an angular rotation of the surround sound tower relative to the base plate and a structure for facilitating rotation of the angular rotation indicating structure.

18 Claims, 4 Drawing Sheets

FOREIGN PATENT DOCUMENTS

| | | | | |
|---|---|---|---|---|
| JP | 62269597 | A | * | 11/1987 |
| JP | 63036698 | A | * | 2/1988 |
| JP | 04175096 | A | * | 6/1992 |
| JP | 04351196 | A | * | 12/1992 |

OTHER PUBLICATIONS

Product Review, Checkpoint Tools, Sound Alignment-System, May 2002.

* cited by examiner

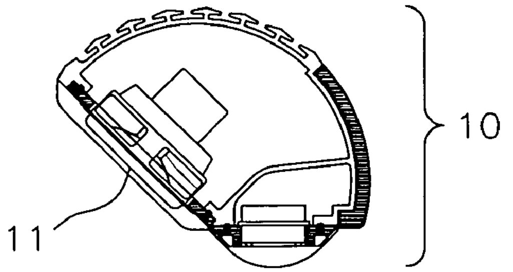
Figure 3
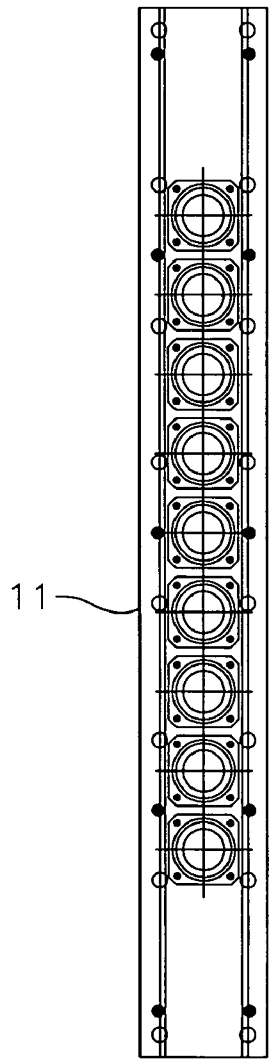
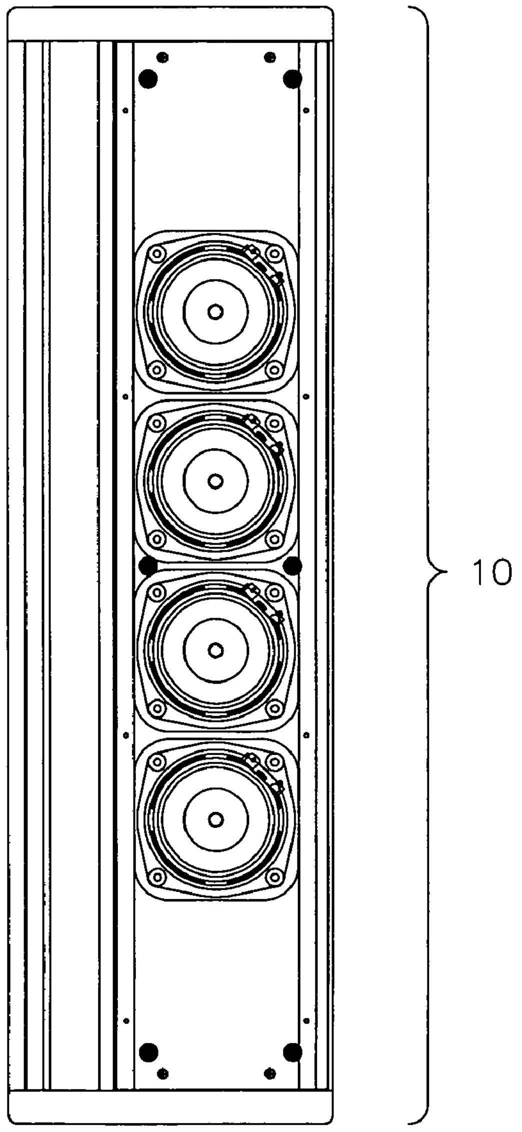
Figure 4 Figure 5

SURROUND SOUND POSITIONING TOWER SYSTEM AND METHOD

TECHNICAL FIELD

The present invention relates to surround sound systems and methods. More particularly, the present invention relates to surround sound tower systems and methods. Even more particularly, the present invention relates to surround sound positioning tower systems and methods.

BACKGROUND ART

Installing a home theater system which recreates the acoustic experience of any given soundtrack is vital to meeting the electronic consumer's expectations. Current art home theater surround sound systems typically comprise compact disc/digital video disc (CD/DVD) players and/or changers, audio/visual (A/V) receivers, tuners, equalizers, headphones, satellite speakers, center channel speakers, woofers, and/or subwoofers disposed in a fixedly mounted rectanguloid housing. Other current art home theater systems comprise highly specialized installation/orientation features which require extensive technical training and are, thus, not well-suited for use by the average electronics consumer. One such current art home theater system comprises a laser-based alignment tool being magnetically attached to a base plate; stacker discs for incrementally varying the height of the base plate; a speaker baffle; a beam splitter; an line lens; and a protractor plate. These complex components require some training and are used for optimizing speaker installation for a given set of room dimensions and conditions. The current art laser-based alignment tool does not allow for flexibility of room geometry nor for facilitating human factors in its use. Therefore, a need is seen to exist for a surround sound positioning tower system and method having a positioning feature for customizing sound direction and constructive interference patterns by the average electronics consumer, especially in a home theater.

DISCLOSURE OF THE INVENTION

The present invention surround sound system and method addresses the current need for a surround sound positioning tower system and method having a positioning feature for customizing sound direction and constructive interference patterns by the average electronics consumer, especially in a home theater. The present invention system comprises consistent geometric alignment of a multi-channel sound system and may be integrated into any type of speaker system. The present invention surround sound system may comprise: a surround sound tower being vertically disposed; a base plate being horizontally disposed; and a structure for positioning the surround sound tower on the base plate, the surround sound tower being mounted on, and normal to, the positioning structure, wherein the positioning structure may comprise: a structure for indicating an angular rotation of the surround sound tower relative to the base plate; and a structure for facilitating rotation of the angular rotation indicating structure, wherein the angular rotation indicating structure may comprise a pointer plate having a visible marking, e.g., a dial, and wherein the facilitating structure may comprise a plurality of ball bearings, and wherein the base plate may comprise a plurality of angular indications, e.g., reference center points and calibrated angular indications for precisely orienting or positioning the tower, wherein the surround sound tower may comprise at least one feature selected from a group consisting essentially of a center channel speaker, and a tweeter module, wherein the tweeter module may comprise: a tweeter; and a detachable permeable tweeter housing disposed around the tweeter. The present invention system may further comprise a binding post disposed at a rear surface of the tower for both electronically and mechanically binding the tower to the positioning structure; and may further comprise a structure for indicating a sonic intensity, wherein the sonic intensity indicating structure may comprise a light pipe. Such light pipe may be disposed on a rear side of the tower for producing a aura visual effect when viewed from a front side.

At least one surround sound system may be simply configured in a home theater environment for customizing sound direction and constructive interference patterns by the average electronics consumer, because each system comprises its own positioning structure, whereby repeatability is provided for any given prior positioning selection in the event that the at least one system becomes disoriented, e.g., by a seismic event. The present invention system may further comprise simulation software for generating precise geometric data; and electro-mechanical actuators, receiving the generated data, for facilitating customizing and/or optimizing sound direction and constructive interference patterns by the average electronics consumer.

The present invention surround sound method, comprises: providing a surround sound tower being vertically disposed; providing a base plate being horizontally disposed; and providing structure for positioning the surround sound tower on the base plate, the surround sound tower being mounted on, and normal to, the positioning structure, wherein the positioning structure providing step may comprise: providing structure for indicating an angular rotation of the surround sound tower relative to the base plate; and providing structure for facilitating rotation of the angular rotation indicating structure, wherein the angular rotation indicating structure providing step may comprise providing a pointer plate having a visible marking, and wherein the facilitating structure providing step may comprise providing a plurality of ball bearings, and wherein the base plate providing step may comprise providing a plurality of angular indications, wherein the surround sound tower providing step may comprise providing at least one feature selected from a group consisting essentially of a center channel speaker, and a tweeter module, wherein the tweeter module providing step may comprise: providing a tweeter; and providing a detachable permeable tweeter housing disposed around the tweeter. The present method may further comprise providing a binding post disposed at a rear surface of the tower for both electronically and mechanically binding the tower to the positioning structure; and may further comprise providing structure for indicating a sonic intensity, wherein the sonic intensity indicating structure may comprise providing a light pipe. The present method may further comprise disposing the light pipe on a rear side of the tower for producing a aura visual effect when viewed from a front side.

The present invention method may further comprise disposing the at least one system in a room by using a tape measure, a string, a rope, or any other tension structure for defining a reference line between any given two systems; aligning the at least one positioning structure of the at least one system to the reference line, thereby precisely disposing the at least one system at a uniform distance from a listening position, and thereby providing repeatability for any given prior positioning selection in the event that the at least one system becomes disoriented, e.g., by a seismic event. The present invention method may further comprise providing simulation software for generating precise geometric data; and providing electromechanical actuators, receiving the generated data, for facilitating customizing and/or optimizing sound direction and constructive interference patterns by the average electronics consumer.

Advantages may include, but are not limited to, simplifying the customization and/or optimization of sound direction and constructive interference patterns by interactively positioning the sound tower and/or at least one sound tower and by modular usage of speakers, economizing floor space by vertically disposing the tower(s) on any horizontal surface, such as a shelf, a platform as well as a floor, especially in a home theater environment by the average electronics consumer. Other features of the present invention are disclosed, or are apparent in the section entitled "Detailed Description of the Invention," disclosed, infra.

BRIEF DESCRIPTION OF THE DRAWING(S)

For a better understanding of the present invention, reference is made to the below referenced accompanying Drawing(s). Reference numbers refer to the same or equivalent parts of the present invention throughout the several figures of the Drawing(s).

FIG. 1 is a perspective view of a surround sound system comprising: a surround sound tower being vertically disposed; a base plate being horizontally disposed; and a structure for angularly positioning the surround sound tower on the base plate, the surround sound tower being mounted on, and normal to, the angularly positioning structure, wherein the angularly positioning structure may comprise: a structure for indicating an angular rotation of the surround sound tower relative to the base plate; and a structure for facilitating rotation of the angular rotation indicating structure, in accordance with the present invention.

FIG. 3 is a cross-sectional view of a tower, showing the angled disposition of the tower having a center channel speaker, in accordance with the present invention.

FIG. 4 is a cut-away front view of a center channel speaker, in accordance with the present invention.

FIG. 5 is a cut-away front view of a tower, in accordance with the present invention.

MODES FOR CARRYING OUT THE INVENTION

Figure 1:
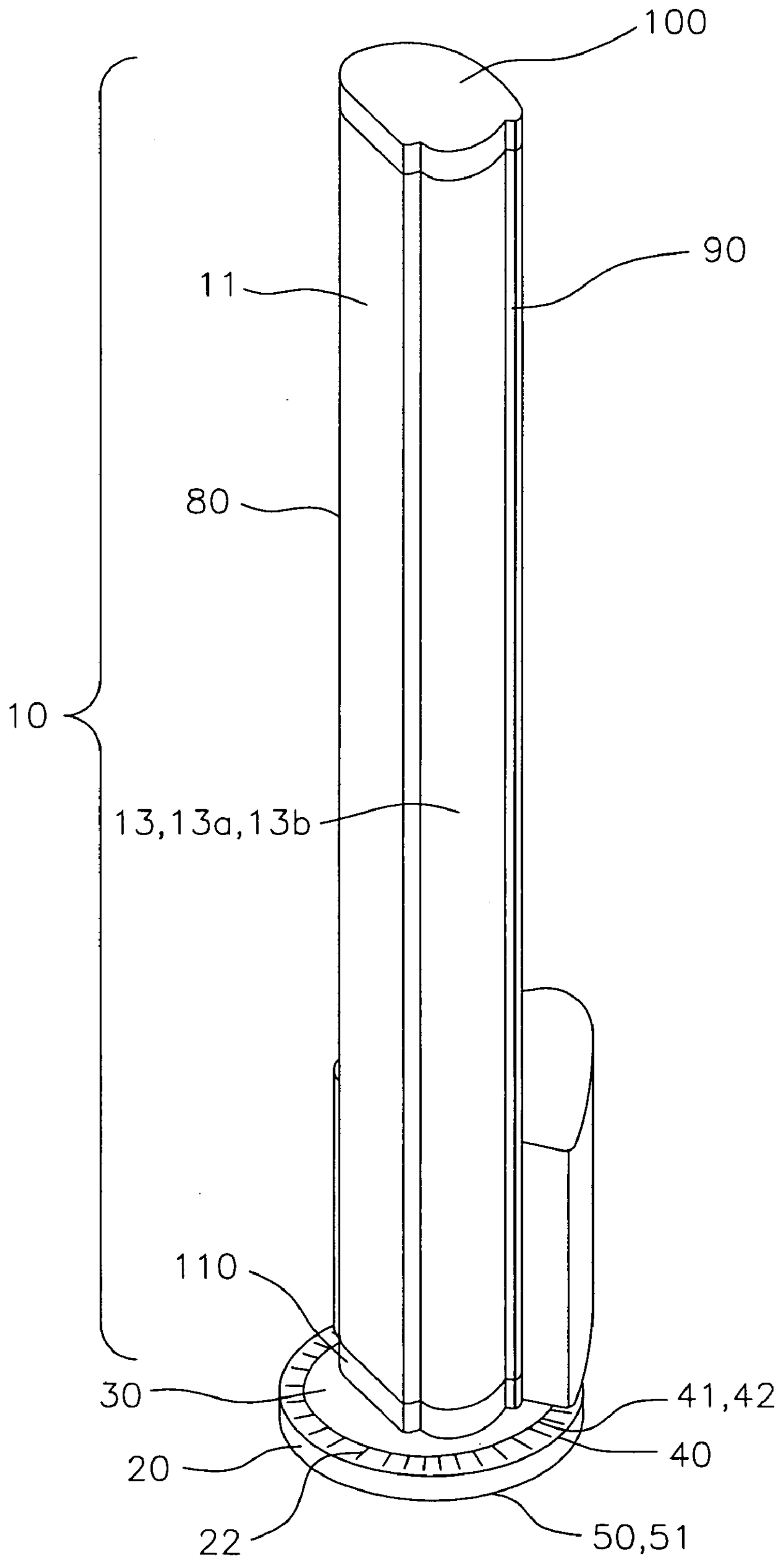

FIG. 1 illustrates, in a perspective view, a surround sound system comprising: a surround sound tower 10 being vertically disposed; a base plate 20 being horizontally disposed; and a structure for angularly positioning 30 the surround sound tower 10 on the base plate 20, the surround sound tower 10 being mounted on, and normal to, the angularly positioning structure 30, wherein the angularly positioning structure 30 may comprise: a structure for indicating an angular rotation 40 of the surround sound tower 10 relative to the base plate 20; and a structure for facilitating rotation 50 of the angular rotation indicating structure 40, wherein the angular rotation indicating structure 40 may comprise a pointer plate 41 having a visible marking 42, e.g., a dial, and wherein the facilitating structure 50 may comprise a plurality of ball bearings 51 (not shown), and wherein the base plate 20 may comprise a plurality of angular indications 22, e.g., reference center points and calibrated angular indications for precisely orienting or positioning the tower, wherein the surround sound tower 10 may comprise at least one feature selected from a group consisting essentially of a center channel speaker 11, and a tweeter module 13, wherein the tweeter module 13 may comprise: a tweeter 13*a*; and a detachable permeable tweeter housing 13*b* disposed around the tweeter 13*a*. The present system may further comprise a binding post 60 (not shown in FIG. 1, but shown in FIG. 2) disposed at a rear surface of the tower 10 for both electronically and mechanically binding the tower 10 to the positioning structure 30; and may further comprise a structure for indicating a sonic intensity 70 (not shown), wherein the sonic intensity indicating structure 70 may comprise a light pipe 71 (not shown), in accordance with the present invention. The present system may further comprise the light pipe 71 (not shown) being disposed on a rear side of the tower 10 for producing an aura visual effect when viewed from a front side.

The surround sound tower 10 may also comprise a grill cloth 80 disposed over the center channel speaker 11, a side trim 90 disposed on the tower 10, a top cap 100 disposed at a top end of the tower 10, and a bottom cap 110 disposed on the pointer plate 41 as shown in FIG. 1. The tweeter module 13, the grill cloth 80, the side trim 90 may each be detachable. Each of the foregoing elements in the present invention may comprise at least one material selected from a group consisting essentially of a polymer, a wood, a metal, an anodized metal, an alloy, and a composite material. Preferably, the base plate 20 comprises a material sufficiently heavy, such as a heavy polymer, a heavy wood (e.g., oak, mahogany, maple), a heavy yet non-toxic metal (e.g., cast or forged iron, cast or forged aluminum), a heavy yet non-toxic anodized metal (e.g., aluminum), a heavy yet non-toxic alloy (e.g., steel, cast steel, forged steel), and a heavy composite material, to support the surround sound tower 10. The light pipe 71 (not shown) may also comprise at least one material selected from a group consisting essentially of Plexiglass®, Lexan®, optic fibers, a fluorescent light source, an incandescent light source, and a phosphorescent light source. The plurality of ball bearings 51 (not shown) may also comprise a lubricant. The visible marking 42 may comprise a colored line and/or a dial on the pointer plate 41 being collinear with the user-adjusted angular position indicated on the base plate 20 or a tapered slot disposed in the pointer plate 41 being locked by, and unlocked from, a detent disposed on the base plate 20.

Figure 2:
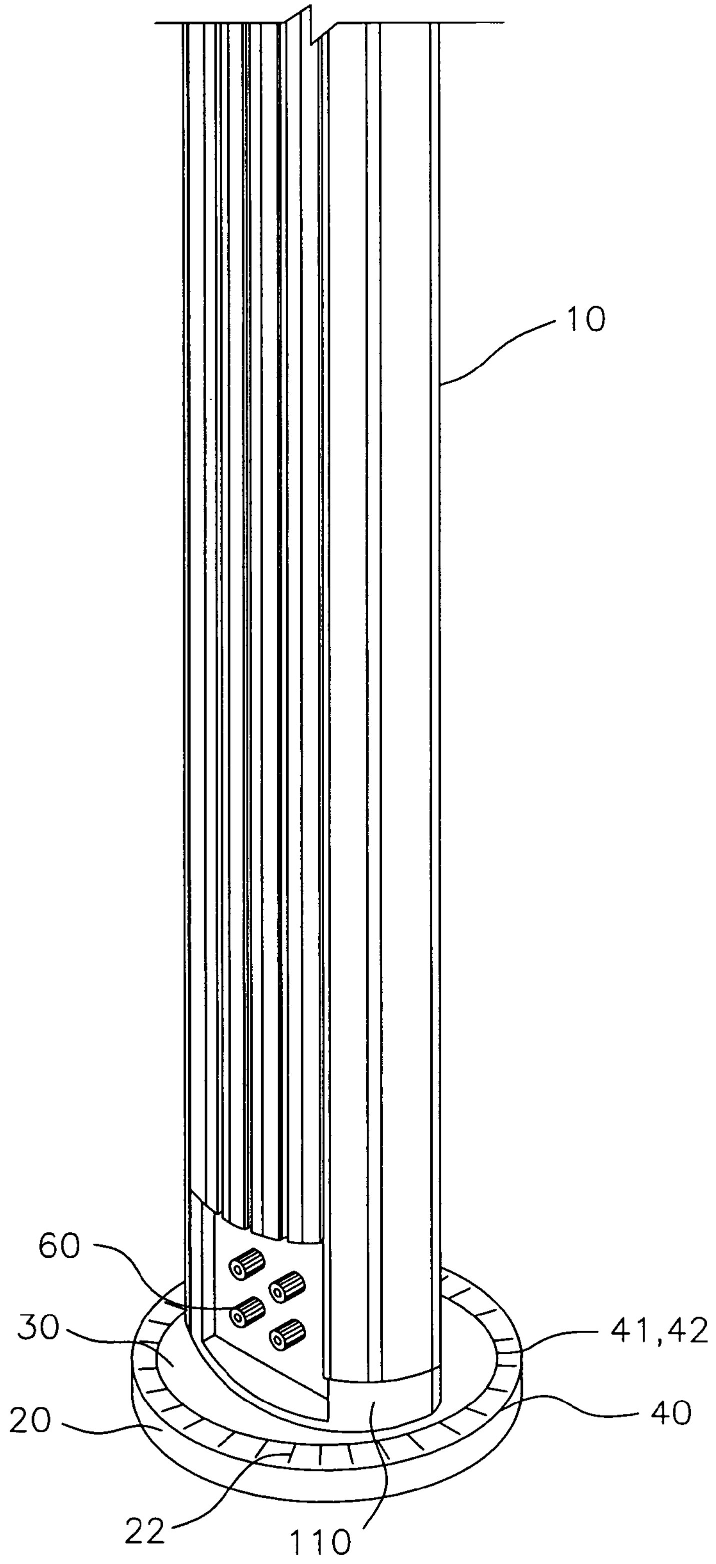
FIG. 2 is a rearward perspective view of a binding post disposed at a rear surface of the tower for both electronically and mechanically the tower to the angularly positioning structure, in accordance with the present invention.

FIG. 2 illustrates, in a rearward perspective view, a binding post 60 (not shown in FIG. 1) disposed at a rear surface of the tower 10 for both electronically and mechanically the tower 10 to a angularly positioning structure 30, in accordance with the present invention.

FIG. 3 illustrates, in a cross-sectional view, a tower 10, and shows the angled disposition of a tower 10 having a center channel speaker 11, in accordance with the present invention.

FIG. 4 illustrates, in a cut-away front view, a center channel speaker 11, in accordance with the present invention.

FIG. 5 illustrates, in a cut-away front view, a tower 10, in accordance with the present invention.

Figure 6:
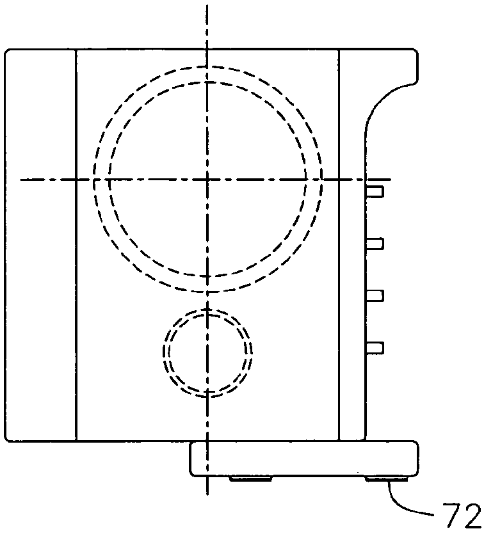
FIG. 6 is a side view of a tower and at least one glide structure, in accordance with the present invention.

FIG. 6 illustrates, in a side view, a tower 10 and at least one glide structure 72, in accordance with the present invention. The glide structure 72 may comprise a smooth material such as Teflon® or any fluorinated polymer.

Figure 7:
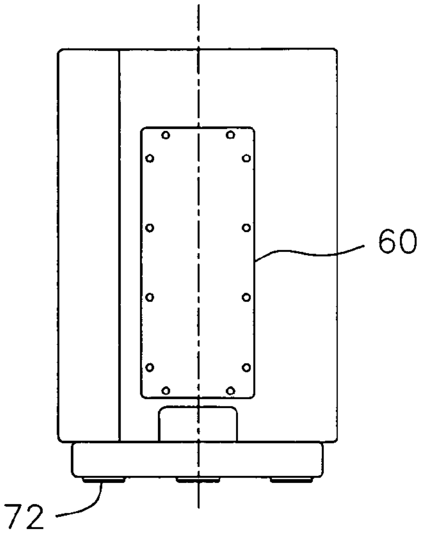
FIG. 7 is a rear view of a tower, showing at least one glide structure and a binding post, in accordance with the present invention.

FIG. 7 illustrates, in a rear view, a tower 10, showing at least one glide structure 72 and a binding post 60, in accordance with the present invention.

Figure 8:
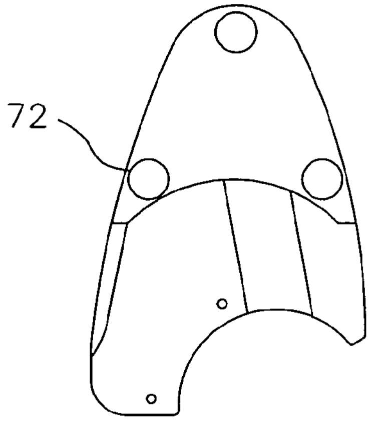
FIG. 8 is a bottom view of a tower, showing at least one glide structure, in accordance with the present invention.

FIG. 8 illustrates, in a bottom view, a tower 10, showing at least one glide structure 72, in accordance with the present invention.

Figure 9:
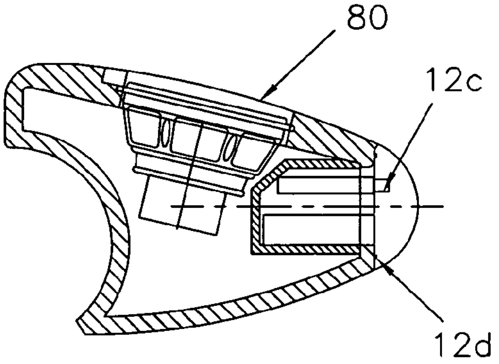
FIG. 9 is a cross-sectional view of a tower, comprising a grill, and an amplifier, in accordance with the present invention.

FIG. 9 is a cross-sectional view of a tower 10, comprising: a grill cloth 80, an amplifier 12*c*, and fastener 12*d*, in accordance with the present invention.

Figure 10:
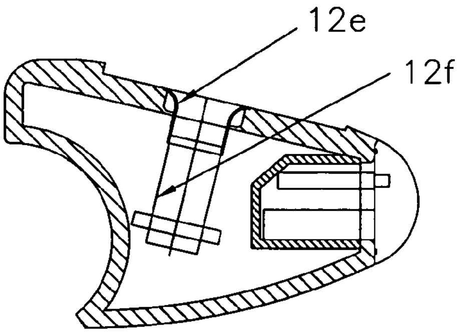
FIG. 10 is a cross-sectional view of a tower, comprising a port tube and a port tube adapter, in accordance with the present invention.
Figure 6:
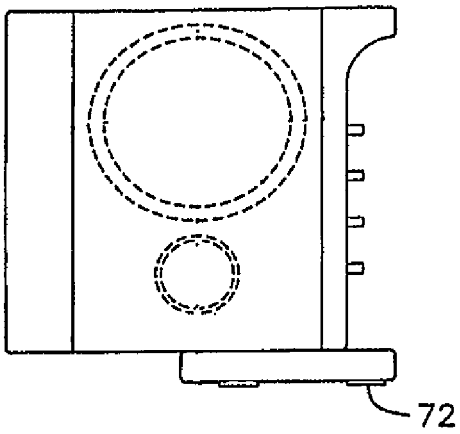
Figure 7:
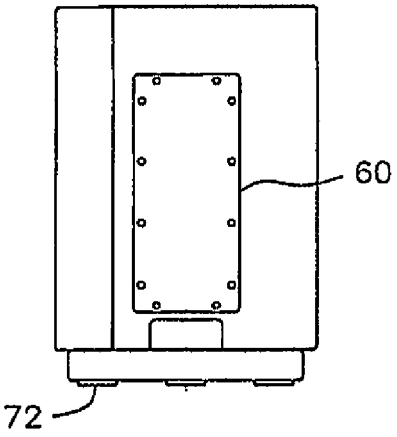
Figure 9:
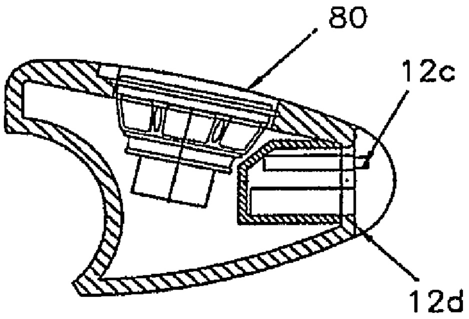
Figure 8:
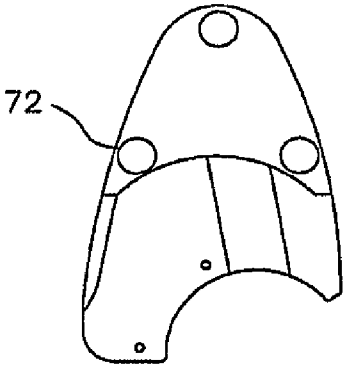
Figure 10:
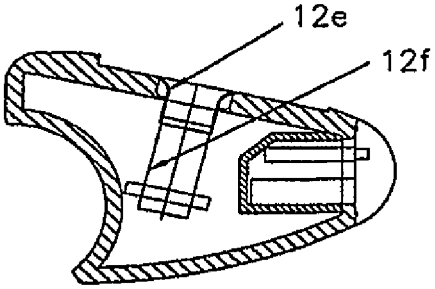

FIG. 10 is a cross-sectional view of a tower 10, comprising a port tube 12*e* and a port tube adapter 12*f*, in accordance with the present invention.

A surround sound method M, comprises: providing a surround sound tower 10 being vertically disposed; providing a base plate 20 being horizontally disposed; and providing a structure for angularly positioning 30 the surround sound tower 10 on the base plate 20, the surround sound tower 10 being mounted on, and normal to, the angularly positioning structure 30, wherein the angularly positioning structure 30 providing step may comprise: providing a structure for indicating an angular rotation 40 of the surround sound tower 10 relative to the base plate 20; and providing a structure for facilitating rotation 50 of the angular rotation indicating structure 40, wherein the angular rotation indicating structure 40 providing step may comprise providing a pointer plate 41 having a visible marking 42, e.g., a dial, and wherein the facilitating structure 50 providing step may comprise providing a plurality of ball bearings 51 (not shown), and wherein the base plate 20 providing step may comprise providing a plurality of angular indications 21, e.g., reference center points and calibrated angular indications for precisely orienting or positioning the tower, wherein the surround sound tower 10 providing step may comprise providing at least one feature selected from a group consisting essentially of a center channel speaker 11, and a tweeter module 13, wherein the tweeter module 13 providing step may comprise: providing a tweeter 13*a*; and providing a detachable permeable tweeter housing 13*b* disposed around the tweeter 13*a*. The present method M may further comprise providing a binding post 60 disposed at a rear surface of the tower 10 for both electronically and mechanically binding the tower 10 to the angularly positioning structure 30; and may further comprise providing a structure for indicating a sonic intensity 70 (not shown), wherein the sonic intensity indicating structure 70 may comprise providing a light pipe 71 (not shown), in accordance with the present invention. The method M may further comprise disposing the light pipe 71 on a rear side of the tower 10 for producing an aura visual effect when viewed from a front side.

The method M may further comprise disposing binding post 60 (not shown in FIG. 1) at a rear surface of the tower 10 for both electronically and mechanically the tower 10 to the angularly positioning structure 30, in accordance with the present invention.

In the method M, the surround sound tower 10 providing step may also comprise providing a grill cloth 80 disposed over the center channel speaker 11, providing a side trim 90 disposed on tower 10, providing a top cap 100 disposed at a top end of the tower 10, and providing a bottom cap 110 disposed on the pointer plate 41. The tweeter module 13 providing step, the grill cloth 80 providing step, and the side trim 90 providing step may each comprise providing each respective element being detachable. Each of the providing steps for the foregoing elements in the present invention may comprise providing at least one material selected from a group consisting essentially of a polymer, a wood, a metal, an anodized metal, an alloy, and a composite material. Preferably, the base plate 20 providing step comprises providing a material sufficiently heavy, such as a heavy polymer, a heavy wood (e.g., oak, mahogany, maple), a heavy yet non-toxic metal (e.g., cast or forged iron, cast or forged aluminum), a heavy yet non-toxic anodized metal (e.g., aluminum), a heavy yet non-toxic alloy (e.g., steel, cast steel, forged steel), and a heavy composite material, to support the surround sound tower 10. The light pipe 71 (not shown) providing step may also comprise at least one material selected from a group consisting essentially of Plexiglass®, Lexan®, optic fibers, a fluorescent light source, an incandescent light source, a phosphorescent light source. The plurality of ball bearings 51 (not shown) providing step may also comprise providing a lubricant. The visible marking 42 providing step may comprise providing a colored line and/or a dial on the pointer plate 41 being collinear with the user-adjusted angular position indicated on the base plate 20 or providing a tapered slot disposed in the pointer plate 41 being locked by, and unlocked from, a detent provided and disposed on the base plate 20.

In the method M, the woofer module 12 providing step may further comprise providing at least one glide structure 72, in accordance with the present invention. The glide structure 72 providing step may comprise providing a smooth material such as Teflon® or any fluorinated polymer. The tower 10 providing step may comprise providing a grill cloth 80, an amplifier 12*c*, and fastener 12*d*, and may further comprise providing a port tube 12*e* and a port tube adapter 12*f*.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, various changes and modifications in form, semiconductor material, and fabrication material detail may be made without departing from the spirit and scope of the inventions as set forth in the appended claims should be readily apparent to those of ordinary skill in the art. No claim herein is to be construed under the provisions of 35 U.S.C. § 112, sixth paragraph, unless the element is expressly recited using the phrase "means for."

INDUSTRIAL APPLICABILITY

The present invention applies industrially to surround sound systems and methods. More particularly, the present invention applies industrially to surround sound tower systems and methods. Even more particularly, the present invention applies industrially to surround sound positioning tower systems and methods.

What is claimed:

1. A surround sound system, comprising: a surround sound tower being vertically disposed; a base plate being horizontally disposed; and means for angularly positioning the surround sound tower on the base plate, the surround sound tower being mounted on, and normal to, the angularly positioning means, wherein the angularly positioning means comprises: means for indicating an angular rotation of the surround sound tower relative to the base plate; and means for facilitating rotation of the angular rotation indicating means.

2. A system, as recited in claim 1, wherein the angular rotation indicating means comprises a pointer plate having a visible marking, wherein the facilitating means comprises a plurality of ball bearings, and wherein the base plate comprises a plurality of angular indications.

3. A system, as recited in claim 1, wherein the surround sound tower comprises at least one feature selected from a group consisting essentially of a center channel speaker and a tweeter module.

4. A system, as recited in claim 3, wherein the tweeter module comprises a tweeter.

5. A system, as recited in claim 4, wherein the tweeter module further comprises a detachable permeable tweeter housing disposed around the tweeter.

6. A system, as recited in claim 5, further comprising a binding post disposed at a rear surface of the tower for both electronically and mechanically the tower to the angularly positioning means.

7. A system, as recited in claim 1, further comprising means for indicating a sonic intensity.

8. A system, as recited in claim 7, wherein the sonic intensity indicating means comprises a light pipe.

9. A surround sound system, comprising:

a surround sound tower being vertically disposed;

a base plate being horizontally disposed;

means for angularly positioning the surround sound tower on the base plate, the surround sound tower being mounted on the angularly positioning means, wherein the angularly positioning means comprises:

means for indicating an angular rotation of the surround sound tower relative to the base plate; and means for facilitating rotation of the angular rotation indicating means, and wherein the base plate comprises a plurality of angular indications, wherein the surround sound tower comprises at least one feature selected from a group consisting essentially of a center channel speaker and a tweeter module;

a binding post disposed at a rear surface of the tower for both electronically and mechanically the tower to the angularly positioning means; and means for indicating a sonic intensity.

10. A surround sound method, comprising: providing a surround sound tower being vertically disposed; providing a base plate being horizontally disposed; and providing means for angularly positioning the surround sound tower on the base plate, the surround sound tower being mounted on, and normal to, the angularly positioning means, wherein the step of providing the angularly positioning means comprises the steps of: providing means for indicating an angular rotation of the surround sound tower relative to the base plate; and providing means for facilitating rotation of the angular rotation indicating means.

11. A method, as recited in claim 10, wherein the angular rotation indicating means providing step comprises providing a pointer plate having a visible marking, wherein the facilitating means providing step comprises providing a plurality of ball bearings, and wherein the base plate providing step comprises providing a plurality of angular indications.

12. A method, as recited in claim 10, wherein the surround sound tower providing step comprises providing at least one feature selected from a group consisting essentially of a center channel speaker and a tweeter module.

13. A method, as recited in claim 12, wherein the tweeter module providing step comprises providing a tweeter.

14. A method, as recited in claim 13, wherein the tweeter module providing step further comprises providing a detachable permeable tweeter housing disposed around the tweeter.

15. A method, as recited in claim 14, further comprising providing a binding post disposed at a rear surface of the tower for both electronically and mechanically the tower to the angularly positioning means.

16. A method, as recited in claim 10, further comprising providing means for indicating a sonic intensity.

17. A method, as recited in claim 16, wherein the sonic intensity indicating means providing step comprises providing a light pipe.

18. A method, as recited in claim 10, wherein the angularly positioning means providing step comprises:

providing means for indicating an angular rotation of the surround sound tower relative to the base plate; and providing means for facilitating rotation of the angular rotation indicating means, wherein the base plate providing step comprises providing a plurality of angular indications, wherein the surround sound tower providing step comprises providing at least one feature selected from a group consisting essentially of a center channel speaker and a tweeter module, further comprising providing a binding post disposed at a rear surface of the tower for both electronically and mechanically the tower to the angularly positioning means; and further comprising providing means for indicating a sonic intensity.

* * * * *

UNITED STATES PATENT AND TRADEMARK OFFICE

CERTIFICATE OF CORRECTION

PATENT NO. : 7,090,047 B1 Page 1 of 1
APPLICATION NO. : 10/655095
DATED : August 15, 2006
INVENTOR(S) : Noel Lee and Demian Martin It is certified that error appears in the above-identified patent and that said Letters Patent is hereby corrected as shown below:

In column 7, line 46: please insert the word -- binding -- after the word “mechanically”.

In column 8, line 2: please insert the word -- binding -- after the word “mechanically”.

In column 8, line 37: please insert the word -- binding -- after the word “mechanically”.

In column 8, line 62: please insert the word -- binding -- after the word “mechanically”.

Signed and Sealed this

Sixth Day of March, 2007

JON W. DUDAS
*Director of the United States Patent and Trademark Office*

UNITED STATES PATENT AND TRADEMARK OFFICE

CERTIFICATE OF CORRECTION

PATENT NO. : 7,090,047 B1
APPLICATION NO. : 10/655095
DATED : August 15, 2006
INVENTOR(S) : Noel Lee et al.

It is certified that error appears in the above-identified patent and that said Letters Patent is hereby corrected as shown below:

IN THE DRAWINGS

Delete drawing sheet 4 of 4, and substitute therefor the attached drawing sheet 4 of 4 consisting of figures 6-10

Signed and Sealed this

Eighteenth Day of September, 2007

JON W. DUDAS
*Director of the United States Patent and Trademark Office*